US012422460B2

(12) United States Patent
Wang (10) Patent No.: US 12,422,460 B2
(45) Date of Patent: Sep. 23, 2025

(54) MONITORING ELECTRICAL PARAMETERS (71) Applicant: Cloudfm Integrated Services Limited, Colchester (GB)

(72) Inventor: Xiao Wang, Colchester (GB)

(73) Assignee: Cloufm Integrated Services Limited, Essex (GB)

( * ) Notice: Subject to any disclaimer, the term of this patent is extended or adjusted under 35 U.S.C. 154(b) by 194 days.

(21) Appl. No.: 18/260,426

(22) PCT Filed: Jan. 6, 2022

(86) PCT No.: PCT/GB2022/050017
§ 371 (c)(1),
(2) Date: Jul. 5, 2023

(87) PCT Pub. No.: WO2022/148959
PCT Pub. Date: Jul. 14, 2022

(65) Prior Publication Data
US 2024/0027503 A1     Jan. 25, 2024

(30) Foreign Application Priority Data

Jan. 6, 2021   (GB) .................................... 2100124

(51) Int. Cl.
*G01R 19/25*        (2006.01)
*G01R 19/00*        (2006.01)
(Continued)

(52) U.S. Cl.
CPC ..... *G01R 19/2513* (2013.01); *G01R 19/0038* (2013.01); *G01R 19/10* (2013.01); *G01R 19/16528* (2013.01)

(58) Field of Classification Search
CPC ........... G01R 19/2513; G01R 19/0038; G01R 19/10; G01R 19/16528; G01R 19/16547; G01R 19/1659; G01R 22/063
See application file for complete search history.

(56) References Cited

U.S. PATENT DOCUMENTS

| 4,039,858 A | 8/1977 | Stewart |
| 4,827,259 A * | 5/1989 | Murphy ................. G01R 19/25 |
| | | 318/636 |

(Continued)

FOREIGN PATENT DOCUMENTS

| CA | 1233522 A | 3/1988 |
| DE | 3344943 A1 | 6/1985 |

(Continued)

OTHER PUBLICATIONS

PCT/GB2022/050017, International Search Report and Written Opinion dated May 5, 2022, 6 pages.

*Primary Examiner* — Dominic E Hawkins
(74) *Attorney, Agent, or Firm* — Andrus Intellectual Property Law, LLP (57) ABSTRACT

A method of monitoring parameters of an electrical installation comprises performing plural successive iterations of a process in which a difference between a current set of one or more monitored parameters of the electrical installation and a previous set of one or more monitored parameters of the electrical installation is compared to a threshold criterion. When the difference is determined as exceeding the threshold criterion, the current set of one or more monitored parameters is transmitted and/or stored. Conversely, when the difference is determined as not exceeding the threshold criterion, the current set of one or more monitored parameters is not transmitted and/or not stored. This can help to reduce the consumption of data bandwidth and/or data storage.

15 Claims, 6 Drawing Sheets

(51) Int. Cl.
*G01R 19/10* (2006.01)
*G01R 19/165* (2006.01)

(56) References Cited

U.S. PATENT DOCUMENTS

| | | |
|---|---|---|
| 10,671,502 B1 * | 6/2020 | Haslam ............... G06F 11/3089 |
| 11,063,555 B2 * | 7/2021 | Sanfilippo ............ G01R 21/133 |
| 2008/0215264 A1 | 9/2008 | Spanier et al. |
| 2016/0231360 A1 * | 8/2016 | Paik ..................... G01R 15/183 |

FOREIGN PATENT DOCUMENTS

| | | |
|---|---|---|
| FR | 2619632 A1 | 2/1989 |
| GB | 1445837 A | 8/1976 |
| GB | 2540687 A | 1/2017 |
| WO | 2000010018 A2 | 2/2000 |
| WO | 2021069509 A1 | 4/2021 |

\* cited by examiner

A. X, P and P-X

FIG 5A

B. illustration of threshold T

FIG 5B

C. within the threshold

FIG 5C

D. beyond the threshold

MONITORING ELECTRICAL PARAMETERS

CROSS-REFERENCE TO RELATED APPLICATIONS

This application is the U.S. national stage application of international application PCT/GB2022/050017 filed Jan. 6, 2022, published as International Publication WO 2022/148959A1 on Jul. 14, 2022. The international application claims priority to British Patent Application No. 2100124.3 filed Jan. 6, 2021. The international application and the British applications are hereby incorporated herein by reference in their entireties.

BACKGROUND AND SUMMARY

The present invention relates to a method of monitoring parameters of an electrical installation and to a system for monitoring parameters of an electrical installation.

It is often desirable to monitor parameters of an electrical installation, for example in order to analyse electricity consumption for predictive maintenance and diagnostic purposes. Example electrical installations which can benefit from such monitoring include domestic, commercial and industrial installations. It is also often desirable to measure and/or derive the parameters locally at the electrical installation, but then to transmit and/or store the parameters remotely from the installation for further analysis. As will be appreciated, when monitoring electrical parameters at a higher frequency and/or when monitoring a greater number of different electrical parameters, a greater amount of data may need to be transmitted and/or stored for the installation. The transmission and/or storage of a greater amount of data will of course consume greater amounts of data bandwidth and/or data storage.

It is desired to provide improvements relating to the monitoring of parameters of electrical installations.

Thus, according to an aspect of the present invention there is provided a method of monitoring parameters of an electrical installation, the method comprising:

performing plural successive iterations of a process in which a difference between a current set of one or more monitored parameters of the electrical installation and a previous set of one or more monitored parameters of the electrical installation is compared to a threshold criterion;

wherein, when the difference is determined as exceeding the threshold criterion, the current set of one or more monitored parameters is transmitted and/or stored; and wherein, when the difference is determined as not exceeding the threshold criterion, the current set of one or more monitored parameters is not transmitted and/or not stored.

Similarly, according to another aspect of the present invention there is provided a system for monitoring parameters of an electrical installation, the system comprising:

processing circuitry configured to perform plural successive iterations of a process in which a difference between a current set of one or more monitored parameters of the electrical installation and a previous set of one or more monitored parameters of the electrical installation is compared to a threshold criterion;

wherein, when the processing circuitry determines that the difference exceeds the threshold criterion, the processing circuitry is configured to transmit and/or store the current set of one or more monitored parameters; and wherein, when the processing circuitry determines that the difference does not exceed the threshold criterion, the processing circuitry is configured not to transmit and/or not to store the current set of one or more monitored parameters.

As will be appreciated, embodiments of the present invention provide a way in which to adequately monitor varying electrical parameters of an electrical installation whilst helping to reduce the consumption of data bandwidth and/or data storage. In particular, by identifying particular sets of one or more monitored parameters for which the threshold criterion is exceeded, and thus for which a notable change in the monitored parameters is more likely to have occurred, and then transmitting and/or storing those particular sets of one or more monitored parameters, embodiments of the present invention can allow adequate monitoring of significant changes in the parameters of the electrical installation. Furthermore, by identifying other particular sets of one or more monitored parameters for which the threshold criterion is not exceeded, and thus for which a notable change in the monitored parameters is less likely to have occurred, and then not transmitting and/or not storing those other particular sets of one or more monitored parameters, embodiments of the present invention can help to reduce the amount of data bandwidth and/or data storage consumed when monitoring the electrical installation. Essentially, embodiments of the present invention provide a way in which to reduce data granularity without significant loss of data fidelity.

In embodiments, the threshold criterion may comprise one or more threshold values. However, in preferred embodiments, the threshold criterion comprises only a single threshold value. The difference which is compared to the threshold criterion may comprise or be based on a modulus of a difference between the current set of one or more monitored parameters and the previous set of one or more monitored parameters.

In some embodiments, the sets of one or more monitored parameters may each comprise only a single monitored parameter. In these embodiments, the difference which is compared to the threshold criterion may comprise or be based on a scalar difference between a current monitored parameter and a previous monitored parameter. The modulus of the scalar difference may be compared with the threshold value. However, in preferred embodiments, the sets of one or more monitored parameters may each comprise plural monitored parameters. These preferred embodiments can help to reduce the processing burden placed on the system by reducing the number of threshold comparisons which need to be made for the plural monitored parameters. In these preferred embodiments, the difference which is compared to the threshold criterion may comprise or be based on a vector difference between a vector formed of the current set of monitored parameters and a vector formed of the previous set of monitored parameters. As will be appreciated, a vector difference between first and second vectors comprises determining a third vector by calculating respective differences between corresponding elements of the first and second vectors. The modulus of the difference vector may be compared with the threshold value.

In preferred embodiments, when the difference is determined as exceeding the threshold criterion, the current set of one or more monitored parameters of the current iteration may become the previous set of one or more monitored parameters in a subsequent iteration, i.e. for comparison with a new "current" set of one or more monitored parameters in that subsequent iteration. In these embodiments, by iteratively updating the previous set of one or more monitored parameters which is used, the suitability of the difference being considered can be maintained over time. Conversely, in preferred embodiments, when the difference is determined as not exceeding the threshold criterion, the current set of one or more monitored parameters of the current iteration may not become the previous set of one or more monitored parameters in a subsequent iteration. Instead, the previous set of one or more monitored parameters of the current iteration may be maintained as the previous set of one or more monitored parameters in a subsequent iteration, i.e. for comparison with a new "current" set of one or more monitored parameters in that subsequent iteration. In these embodiments, by not updating the previous set of one or more monitored parameters which is used, the suitability of the difference being considered can again be maintained over time.

In preferred embodiments, the threshold criterion may be based on the previous set of one or more monitored parameters. These embodiments can help to provide a threshold criterion for comparison with the difference which is well suited to the particular electrical installation in question. When the difference is determined as exceeding the threshold criterion, the threshold criterion may be updated based on the current set of one or more monitored parameters (which, in a subsequent iteration, may then become the previous set of one or more monitored parameters for comparison with a new "current" set of one or more monitored parameters). In these embodiments, by iteratively updating the threshold criterion based on particular sets of one or more monitored parameters for which the threshold criterion is exceeded, the suitability of the threshold criterion for comparison with subsequent current sets of one or more monitored parameters can be maintained over time. Conversely, in preferred embodiments, when the difference is determined as not exceeding the threshold criterion, the threshold criterion may not be updated based on the current set of one or more monitored parameters. In these embodiments, by not updating the threshold criterion based on other particular sets of one or more monitored parameters for which the threshold criterion is not exceeded, the processing burden placed on the system can be reduced and the threshold criterion can be prevented from drifting over time due to gradual changes in the sets of one or more monitored parameters.

In embodiments, the threshold criterion may be derived from (based on or updated based on) the set of one or more monitored parameters in question using a formula, such as a linear formula or non-linear (e.g. quadratic) formula. The formula may scale and/or offset the set of one or more monitored parameters in question. As discussed above, in some embodiments, the sets of one or more monitored parameters may each comprise only a single monitored parameter. In these embodiments, the formula may be applied to the single monitored parameter in question. For example, the single monitored parameter can be scaled and/or offset. However, as discussed above, in preferred embodiments, the sets of one or more monitored parameters may each comprise plural monitored parameters. In these preferred embodiments, the formula may be applied to the modulus of a vector formed of the set of monitored parameters in question. For example, the modulus of the vector formed of the set of monitored parameters can be scaled and/or offset. The scaling value and/or offset value may be preselected to give any desired monitoring behaviour. For example, the scaling value may be selected to provide any desired data granularity and/or the offset value may be selected based on a statistical property (e.g. standard deviation) across plural previous sets of one or more measured parameters.

In embodiments, when the difference is determined as exceeding the threshold criterion, the process may further comprise determining whether or not a minimum time period has elapsed between obtaining the current set of one or more monitored parameters and obtaining the previous set of one or more monitored parameters. When the minimum time period is determined as having elapsed, the current set of one or more monitored parameters may be transmitted and/or stored, and/or the threshold criterion may be updated based on the current set of one or more monitored parameters, in the manner discussed above. However, when the minimum time period is determined as not having elapsed, the current set of one or more monitored parameters may not be transmitted and/or may not be stored, and/or the threshold criterion may not be updated based on the current set of one or more monitored parameters, regardless of the threshold criterion having been exceeded. These embodiments can help to avoid the system transmitting and/or storing parameters, and/or updating the threshold criterion, at too high a frequency. The minimum time period may accordingly be preselected as desired.

In embodiments, when the difference is determined as not exceeding the threshold criterion, the process may further comprise determining whether or not a maximum time period has elapsed between obtaining the current set of one or more monitored parameters and obtaining the previous set of one or more monitored parameters. When the maximum time period is determined as not having elapsed, the current set of one or more monitored parameters may not be transmitted and/or may not be stored, and/or the threshold criterion may not be updated based on the current set of one or more monitored parameters, in the manner discussed above. However, when the maximum time period is determined as having elapsed, the current set of one or more monitored parameters may be transmitted and/or stored, and/or the threshold criterion may be updated based on the current set of one or more monitored parameters, regardless of the threshold criterion having not been exceeded. These embodiments can help to avoid the system transmitting and/or storing parameters, and/or updating the threshold criterion, at too low a frequency. The maximum time period may accordingly be preselected as desired. The maximum time period may be longer than the minimum time period.

In embodiments, the sets of one or more monitored parameters may comprise or be based on one or more electrical values of the electrical installation. For example, the sets of one or more monitored parameters may comprise or be based on one or more voltage values, current values, power values, frequency values, phase values, and/or harmonic content values, etc. The sets of one or more monitored parameters may comprise or be based on one or more instantaneous values, absolute values, average (e.g. RMS) values, maximum values (e.g. in a given time period), and/or minimum values (e.g. in a given time period), etc. The sets of one or more monitored parameters may comprise or be based on one or more active values, reactive values, complex values, and/or apparent values, etc.

In embodiments, the system may comprise sampling circuitry configured to sample one or more electrical (e.g. current or voltage) values of the electrical installation and to provide the one or more sampled electrical values to the processing circuitry. The processing circuitry may be configured to receive the one or more sampled electrical values and to derive the sets of one or more monitored parameters therefrom. The sampling circuitry may be configured to sample the one or more electrical values at a frequency of at least 10 kHz, such as at least 25 kHz. As will be appreciated, a higher frequency can provide greater accuracy but with the potential disadvantage of greater bandwidth consumption and/or data storage, whereas a lower frequency can provide reduced accuracy but with the potential advantage of reduced bandwidth consumption and/or data storage. The frequencies disclosed herein have been identified as providing an optimal balance between accuracy and bandwidth consumption when using the data reduction processes described herein.

In embodiments, the sampling circuitry may comprise one or more input data channels configured to sample a respective electrical (e.g. current or voltage) value. For example, the sampling circuitry may comprise at least 10, 25 or 50 input data channels configured to sample a respective electrical value. The one or more electrical values may be provided to the input data channels via a respective connector. The connectors may each be connected to a respective electrical (e.g. current or voltage) sensor.

In embodiments, the sampling circuitry may comprise at least two different types of input data channels. For example, the sampling circuitry may comprise one or more input data channels configured to provide a respective current value and one or more input data channels configured to provide a respective voltage value. The sampling circuitry may comprise more current input data channels than voltage data channels. For example, the sampling circuitry may comprise at least 10, 25 or 50 current input data channels and fewer than 5 voltage input data channels (e.g. only a single voltage input data channel). In this regard, it has been identified that it is generally desirable to directly monitor current values (e.g. to accurately determine current amplitude, frequency, phase and/or harmonic content for each current data channel) but that plural voltage values can instead be estimated from a single voltage value (e.g. to approximately determine power consumption corresponding to each current data channel). The voltage estimation may comprise applying a suitable phase shift to the voltage channel which is being directly monitored, such as 0°, 120° or 240° for an ideal 3-phase supply. These embodiments can further help to reduce the amount of processing, bandwidth and/or storage required to monitor the electrical installation.

In embodiments, the sampling circuitry may comprise one or more (e.g. current) input data channels not having an amplifier. The sampling circuitry may comprise one or more (e.g. voltage) input data channels having an amplifier for amplifying the electrical value. The amplifier may comprise an isolation amplifier.

In embodiments, the sampling circuitry may comprise one or more multiplexers configured to multiplex plural input data channels onto a single multiplexed data channel. The sampling circuitry may comprise an ADC configured to digitise the multiplexed data channel onto a digitised data channel. The processing circuitry may be configured to receive the digitised data channel and to derive the sets of one or more monitored parameters therefrom. The processing circuitry may be configured to select (demultiplex) one or more input data channels from plural input data channels and to derive the sets of one or more monitored parameters therefrom.

In preferred embodiments, the sampling circuitry may comprise plural primary multiplexers each configured to multiplex a subset of plural (e.g. current) input data channels onto a single primary multiplexed data channel. The sampling circuitry may comprise a secondary multiplexer configured to multiplex plural primary multiplexed data channels onto a single secondary multiplexed data channel. The secondary multiplexer may also multiplex one or more non-multiplexed (e.g. voltage) data channels onto the single secondary multiplexed data channel. The secondary multiplexer may comprise a higher speed multiplexer than the primary multiplexer. In these embodiments, the ADC may be configured to digitise the secondary multiplexed data channel onto the digitised data channel Again, the processing circuitry may be configured to receive the digitised data channel and to derive the sets of one or more monitored parameters therefrom. The processing circuitry may be configured to select (demultiplex) one or more input data channels from plural input data channels and to derive the sets of one or more monitored parameters therefrom.

In embodiments, the system may comprise transmitting circuitry configured to transmit the sets of one or more monitored parameters. The sets of one or more monitored parameters may be transmitted via a wired and/or wireless interface. The sets of one or more monitored parameters may be transmitted to one or more servers remote from the system. Alternatively, or additionally, the sets of one or more monitored parameters may be stored locally within electronic storage of the system. The electronic storage may comprise one or more memories accessible to the processing circuitry.

In embodiments, the method may comprise operating in a first mode of operation in which the threshold criteria are not used and then operating in a second mode of operation in which the threshold criteria are used. In other embodiments, the method may comprise operating in a first mode of operation in which first threshold criteria are used and then operating in a second mode of operation in which second threshold criteria are used, with the second threshold criteria being higher than the first threshold criteria. In any of these embodiments, the first mode of operation may allow the electrical installation to be initially analysed at a higher data granularity, for example to build up a model for the electrical installation, whereas the second mode of operation may allow the electrical installation to continue to be analysed but at a lower data granularity, for example using the model of the electrical installation.

In embodiments, the electrical installation may comprise a domestic, commercial or industrial installation, such as an electrical installation for a living accommodation (house or apartment block), office, school, college, university, hotel, hospital, shop, restaurant, station, airport, manufacturing facility, etc.

As will be appreciated, the method described herein may comprise performing any of the functional steps which are performed by the system (e.g. performed by the processing circuitry). Similarly, the system (e.g. the processing circuitry) described herein may be configured accordingly to perform any of the functional steps of the method described herein.

BRIEF DESCRIPTION OF THE DRAWINGS

By way of example only, embodiments of the present invention will now be described in detail with reference being made to the accompanying drawings in which.

DETAILED DESCRIPTION

Figure 1:
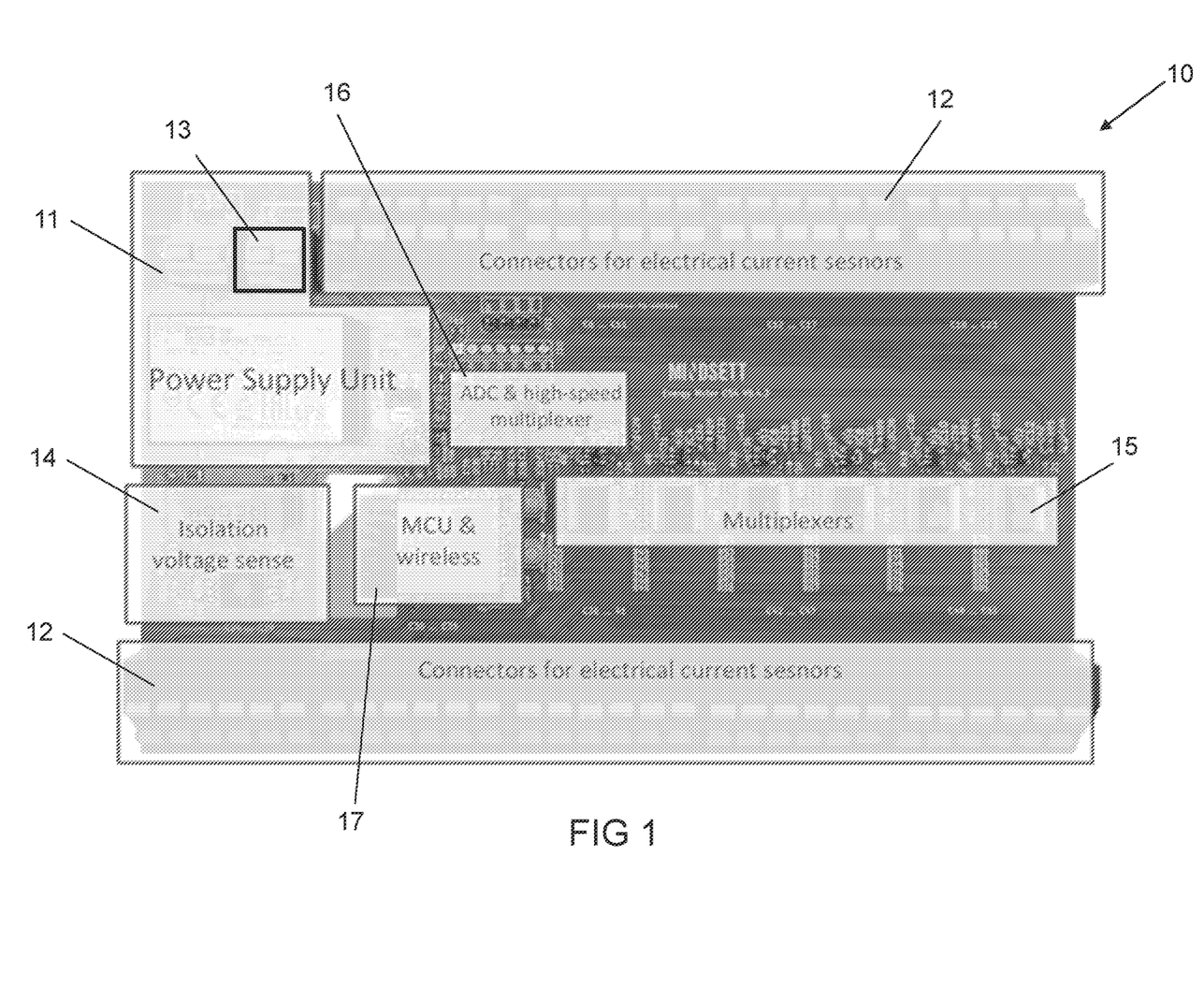
FIG. 1 shows a physical layout of a system for monitoring parameters of an electrical installation according to an embodiment of the present invention.
Figure 2:
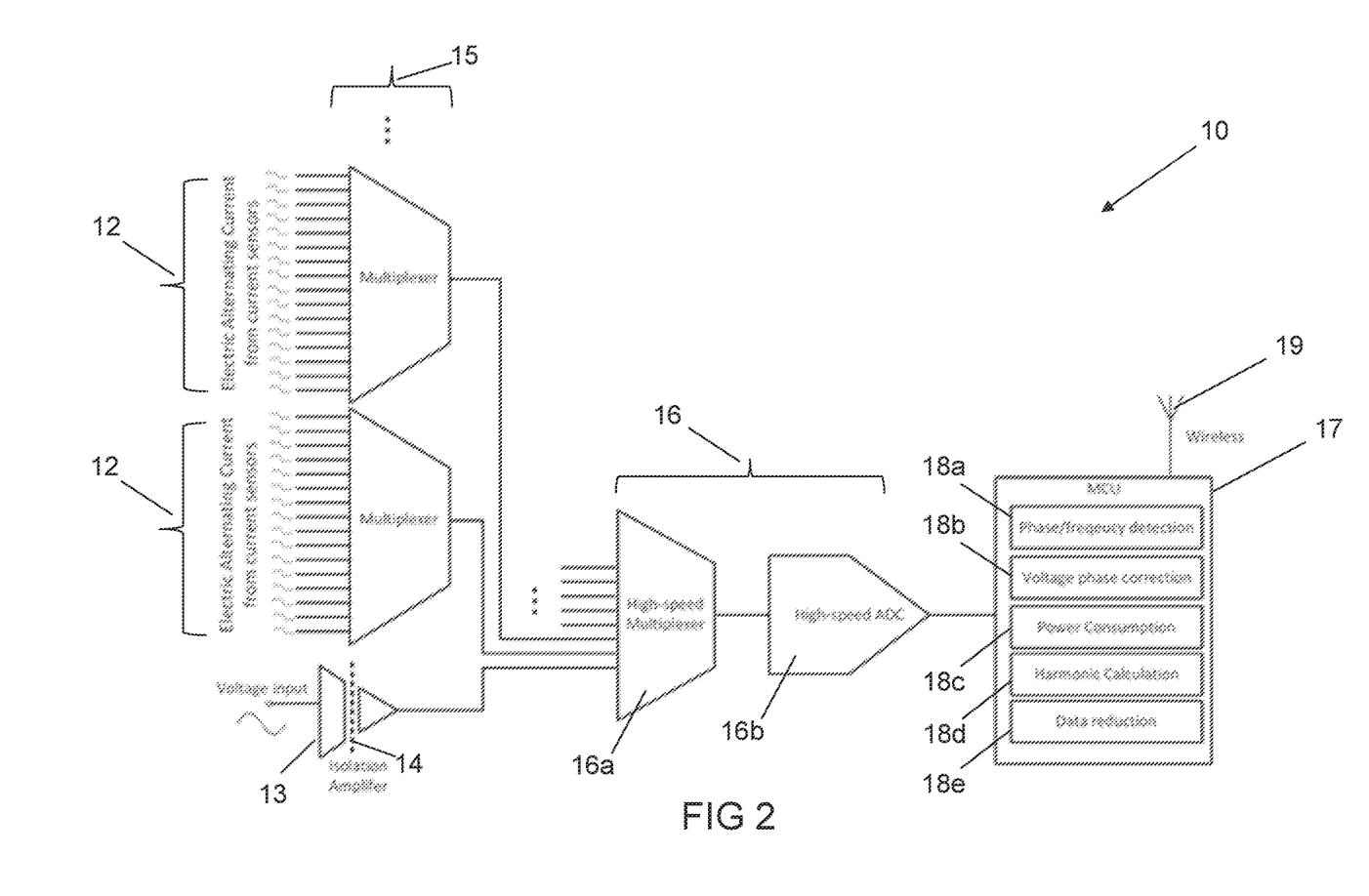
FIG. 2 is a schematic illustration of the system of FIG. 1.

FIGS. 1 and 2 show features of a PCB mounted system 10 for monitoring parameters of an electrical installation, such as a domestic, commercial or industrial installation. The system 10 is powered via a power supply unit 11. The system 10 comprises various sampling circuitry that samples electrical values of the electrical installation. In this embodiment, the sampling circuitry includes fifty-four current input data channels 12 for sampling respective current values of the electrical installation via a respective connector pair which can be connected to a respective current sensor coil. The fifty-four current input data channels 12 are arranged in nine subsets of six current input data channels. In this embodiment, the sampling circuitry further includes a single voltage input data channel 13 for sampling a voltage value of the electrical installation via a further connector pair which can be connected to a voltage sensor. The voltage value is amplified and isolated using an isolation amplifier 14. The single voltage input data channel 13 is used to derive an approximate voltage value for each of the current input data channels 12. The sampling circuitry further comprises plural primary multiplexers 15 that each multiplex a subset of current input data channels onto a respective single primary multiplexed current data channel. The sampling circuitry further includes an arrangement 16 having a secondary high-speed multiplexer 16a that multiplexes the plural primary multiplexed current data channels and the voltage data channel onto a single secondary multiplexed data channel and a high-speed ADC 16b that digitises the secondary multiplexed data channel onto a digitised data channel. In this embodiment, the sampling circuitry can sample the electrical values at a frequency of at least 25 kHz. The system 10 further comprises processing circuitry 17 that receives the digitised data channel, selects (demultiplexes) one or more input data channels from the plural input data channels, and derives sets of one or more monitored parameters therefrom. In this embodiment, the processing circuitry 17 performs phase/frequency detection 18a, voltage phase correction 18b, power consumption calculations 18c, harmonic content calculations 18d and a data reduction process 18e. The system 10 further comprises transmitting circuitry 19 that transmits monitored parameters wirelessly to a remote server in accordance with the data reduction process 18e. The data reduction process 18e will now be described in more detail below with reference to FIGS. 3-6.

Figure 3:
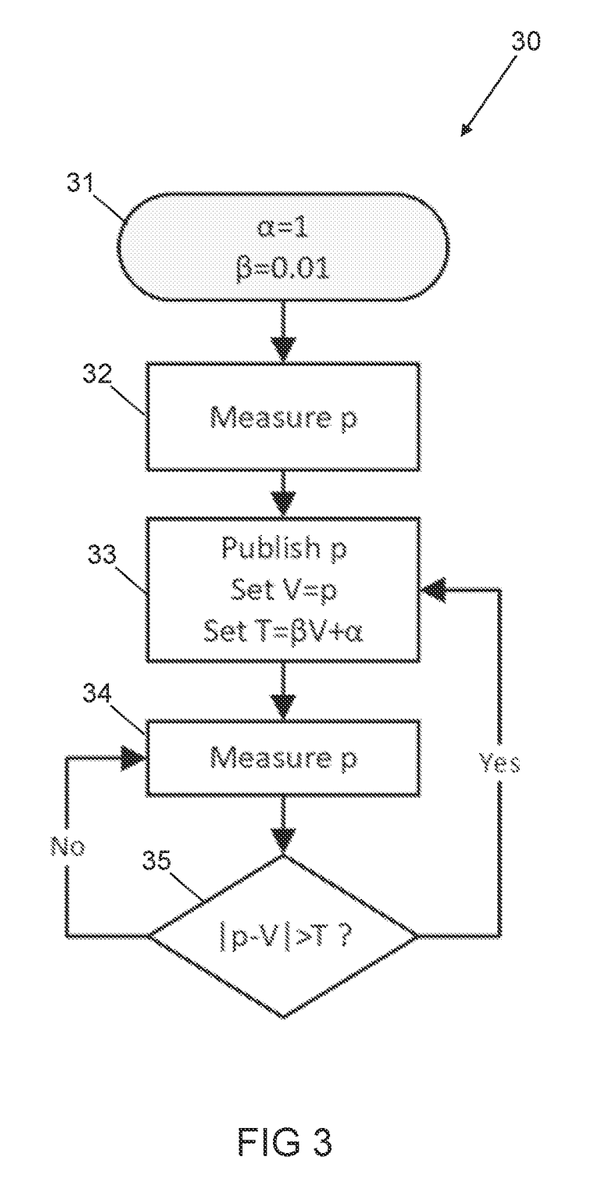
FIG. 3 is a method of data reduction according to an embodiment of the present invention.

FIG. 3 illustrates a method of data reduction 30. In this embodiment, in step 31, a threshold offset value ($\alpha$) is set to be 1 and a threshold scaling value ($\beta$) is set to be 0.01. Then, in step 32, a single monitored parameter (p) is determined (e.g. measured, calculated or derived). Then, in step 33, the current monitored parameter (p) is transmitted to the remote server ("publish p"), the current monitored parameter (p) is then considered as being a previous monitored parameter (V), and a threshold criterion in the form of a threshold value (T) is set using a linear formula such that $T=\beta V+\alpha$. Then, in step 34, a new current monitored parameter (p) is determined. Then, in step 35, the modulus of the difference between the current monitored parameter (p) and previous monitored parameter (V) is compared to the threshold value (T). If the difference exceeds the threshold, the method returns to step 33, in which the current monitored parameter (p) is transmitted to the remote server ("publish p"), the current monitored parameter (p) is now considered as being the previous monitored parameter (V), and the threshold value (T) is updated such that $T=\beta V+\alpha$. The method then continues again to step 34. However, if the difference does not exceed the threshold, the method returns directly to step 34 without transmitting the current monitored parameter and without updating the previous monitored parameter (V) or threshold value (T). The method then continues to step 35 again and so on through successive iterations.

An example of the method of FIG. 3 is illustrated in the table below, in which the monitored parameter is real power and in which the initial published real power was 3.4 watts.

| Iteration | Current Real Power (p) | Previous Real power (V) | Threshold Value T | Difference P – V | Publish p? | Value Published |
|---|---|---|---|---|---|---|
| 1 | 3.2 | 3.4 | 1.034 | −0.2 | No | |
| 2 | 3.8 | 3.4 | 1.034 | 0.4 | No | |
| 3 | 4.0 | 3.4 | 1.034 | 0.6 | No | |
| 4 | 5.2 | 3.4 | 1.034 | 1.8 | Yes | 5.2 |
| 5 | 961.2 | 5.2 | 1.052 | 956.0 | Yes | 961.2 |
| 6 | 966.1 | 961.2 | 10.612 | 4.9 | No | |
| 7 | 960.1 | 961.2 | 10.612 | −1.1 | No | |
| 8 | 952.2 | 961.2 | 10.612 | −9.0 | No | |
| 9 | 955.5 | 961.2 | 10.612 | −5.7 | No | |
| 10 | 1712.9 | 961.2 | 10.612 | 751.7 | Yes | 1712.9 |

As is shown above, only three values are published instead of ten. This data reduction method 30 accordingly provides a way in which to adequately monitor a varying electrical parameter of an electrical installation whilst also helping to reduce the consumption of data bandwidth.

Figure 4:
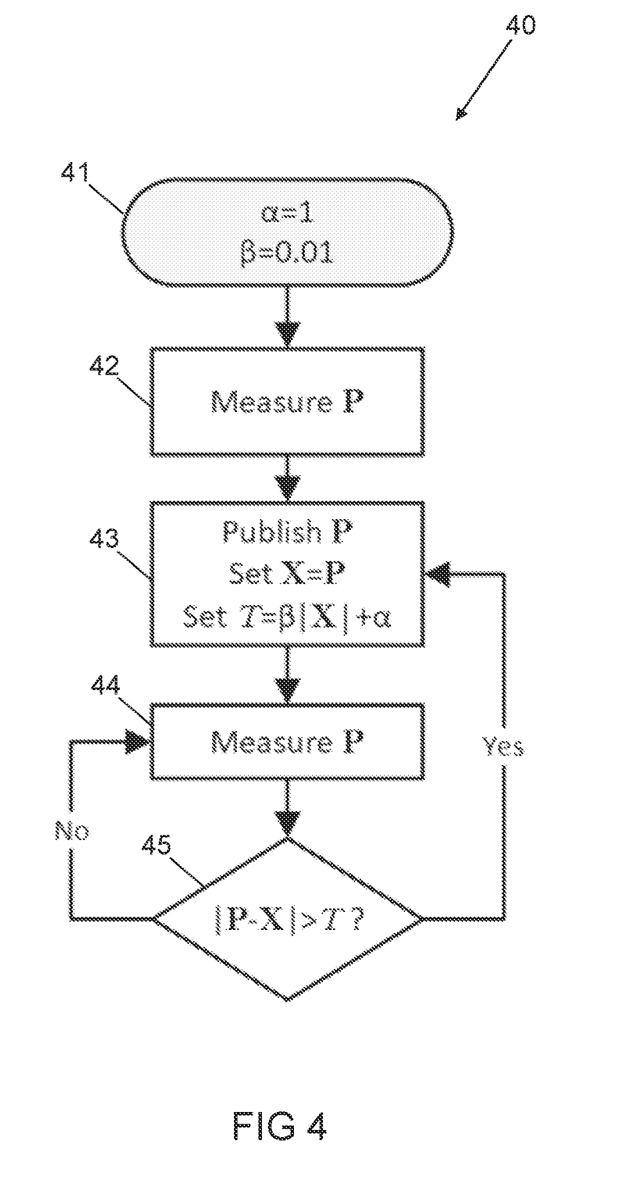
FIG. 4 is a method of data reduction according to another embodiment of the present invention.

FIG. 4 illustrates another method of data reduction 40. In this embodiment, in step 41, a threshold offset value ($\alpha$) is again set to be 1 and a threshold scaling value ($\beta$) is again set to be 0.01. Then, in step 42, a vector of plural monitored parameters (P) is determined (e.g. measured, calculated or derived). Then, in step 43, the current vector of monitored parameters (P) are transmitted to the remote server ("publish P"), the current vector of monitored parameters (P) is then considered as being a previous vector of monitored parameters (X), and a threshold criterion in the form of a threshold value (T) is set using a linear formula such that $T=\beta|X|+\alpha$. Then, in step 44, a new current vector of plural monitored parameters (P) is determined. Then, in step 45, the modulus of the vector difference between the current vector of monitored parameters (P) and the previous vector of monitored parameters (X) is compared to the threshold value (T). If the difference exceeds the threshold, the method returns to step 43, in which the current vector of monitored parameters (P) are transmitted to the remote server ("publish P"), the current vector of monitored parameters (P) is now considered as being the previous vector of monitored parameters (X), and the threshold value (T) is updated such that $T=\beta|X|+\alpha$. The method then continues again to step 44. However, if the difference does not exceed the threshold, the method returns directly to step 44 without transmitting the current vector of monitored parameters (P) and without updating the previous vector of monitored parameters (X) or threshold value (T). The method then continues to step 45 again and so on. This data reduction method 40 accordingly provides a way in which to adequately monitor a set of plural varying electrical parameters of an electrical installation whilst also helping to reduce the consumption of data bandwidth.

Figure 5A:
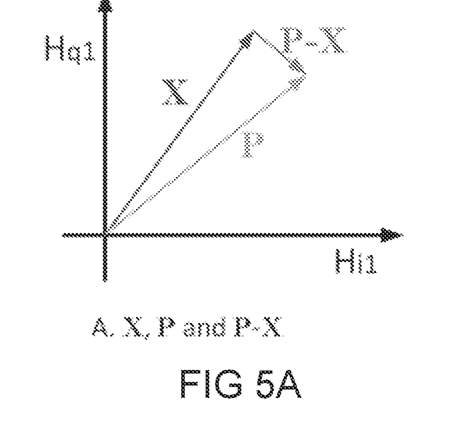
FIGS. 5A-5D show graphical illustrations of the sets of monitored parameters and the threshold criterion used in the method of FIG. 4.
Figure 5B:
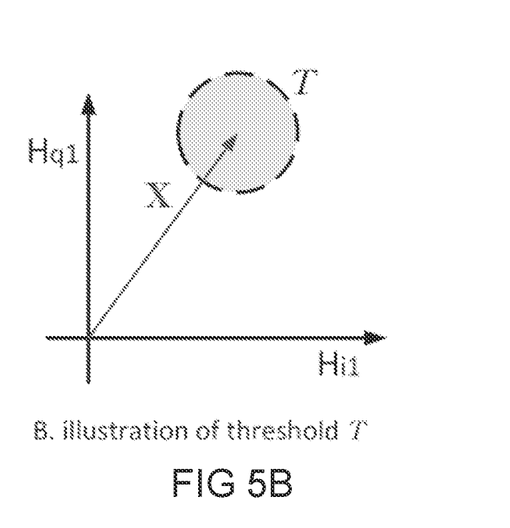
Figure 5C:
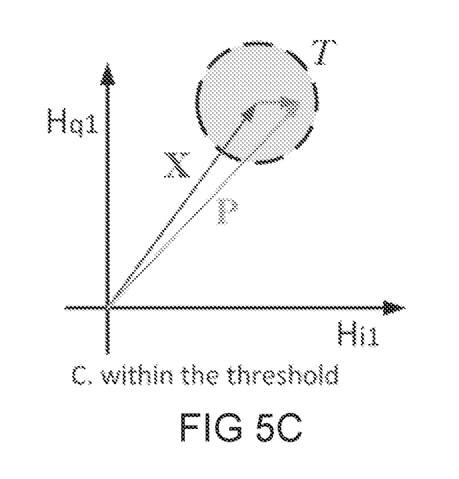
Figure 5D:
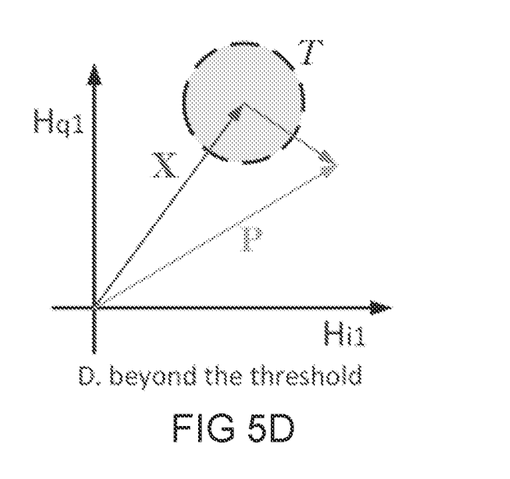

FIGS. 5A-5D are a graphical illustration of the sets of monitored parameters and the threshold criterion used in the method of FIG. 4. FIG. 5A illustrates a current vector P formed from two monitored parameters, a previous vector X formed from the two monitored parameters, and a vector difference P–X between the current vector P and previous vector X. FIG. 5B then illustrates a notional threshold region defined by the threshold T with respect to the previous vector X. FIG. 5C then illustrates a vector difference P–X which falls within the notional threshold region defined by the threshold T, i.e. in which the modulus of the vector difference |P–X| is less than T. On the other hand, FIG. 5D illustrates a vector difference P–X which extends beyond the notional threshold region defined by the threshold T, i.e. in which the modulus of the vector difference |P–X| is greater than T. In these examples, the sets of monitored parameters comprise a first in-phase harmonic value Hi1 and a first quadrature harmonic value Hq1, and so the corresponding vectors are two dimensional. In this regard, each current harmonic can be represented as a vector having a magnitude and an angle relative to the voltage. Accordingly, the "first in-phase harmonic value" is the vector component of the first current harmonic which is in phase with the voltage and the "first quadrature harmonic value" is the vector component of the first current harmonic which is orthogonal to the voltage. However, as will be appreciated, sets of different monitored parameters having more than two dimensions could be used in a similar manner. For example, two or more voltage values, current values, power values, frequency values, phase values, and/or harmonic content values, etc., could be considered together as a multidimensional vector of monitored parameters.

Figure 6:
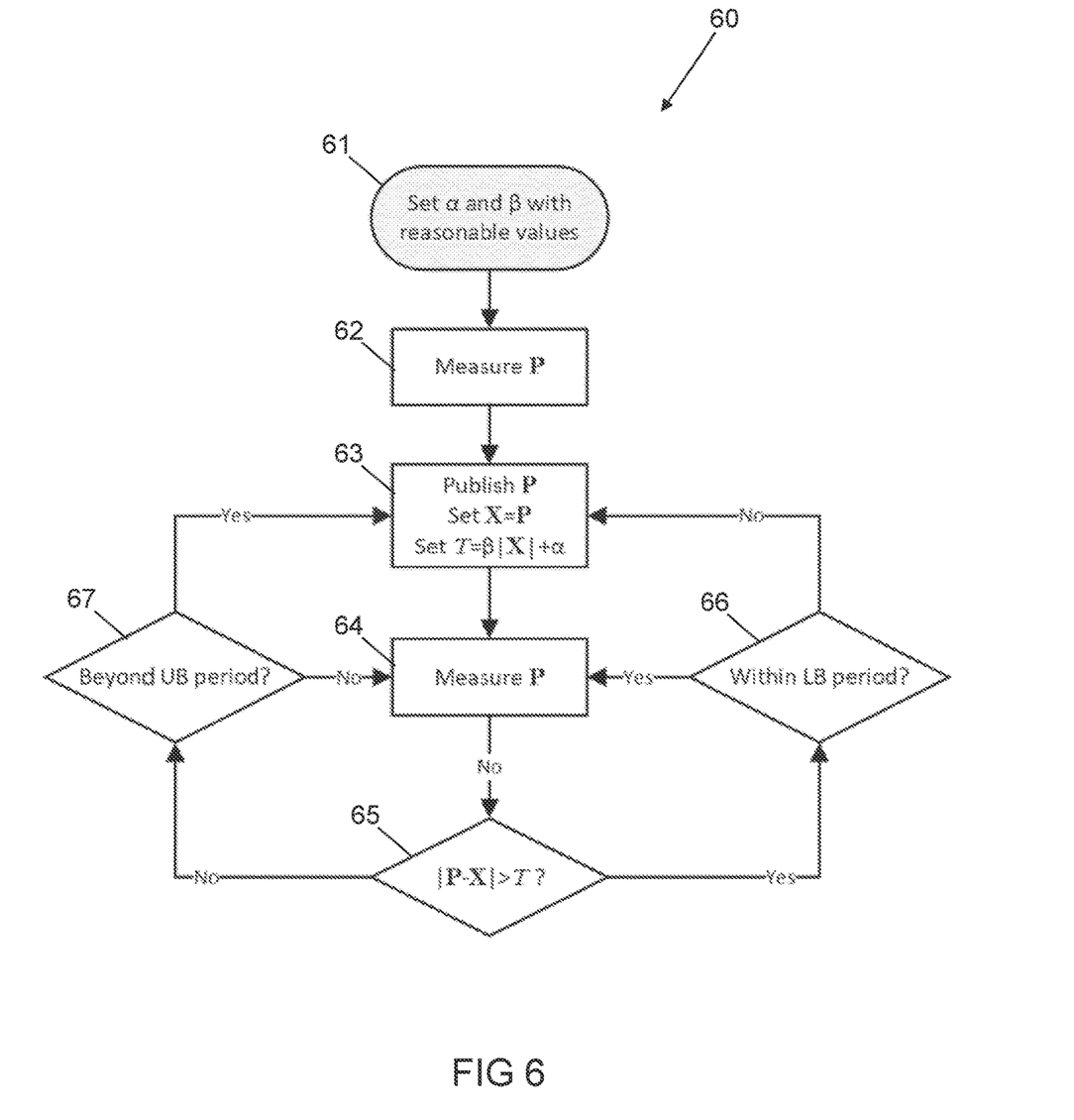
FIG. 6 is a method of data reduction according to yet another embodiment of the present invention.

FIG. 6 illustrates yet another method of data reduction 60. In this embodiment, in step 61, a threshold offset value ($\alpha$) and a threshold scaling value ($\beta$) are again set to reasonable values. For example, the scaling value ($\beta$) can be selected to provide a desired data granularity and the offset value ($\alpha$) can be selected to be two standard deviations across plural sets of measured parameters, but other selection criteria for the threshold offset value ($\alpha$) and threshold scaling value ($\beta$) can be used as desired. Then, in step 62, a vector of plural monitored parameters (P) is determined (e.g. measured, calculated or derived). Then, in step 63, the current vector of monitored parameters (P) are transmitted to the remote server ("publish P"), the current vector of monitored parameters (P) is then considered as being a previous vector of monitored parameters (X), and a threshold criterion in the form of a threshold value (T) is set using a linear formula such that $T=\beta|X|+\alpha$. Then, in step 64, a new current vector of plural monitored parameters (P) is determined. Then, in step 65, the modulus of the vector difference between the current vector of monitored parameters (P) and previous vector of monitored parameters (X) is compared to the threshold value (T). If the difference exceeds the threshold, the method proceeds to step 66, in which it is determined whether or not a minimum time period (LB) has elapsed between obtaining the current vector of monitored parameters (P) and obtaining the previous vector of monitored parameters (X). In this embodiment, the minimum time period (LB) is 5 seconds, although other minimum time periods could be used as desired. If the minimum time period (LB) has elapsed, the method returns to step 63, in which the current vector of monitored parameters (P) are transmitted to the remote server ("publish P"), the current vector of monitored parameters (P) is now considered as being the previous vector of monitored parameters (X), and the threshold value (T) is updated such that $T=\beta|X|+\alpha$, as per FIG. 4. However, in this embodiment, if the minimum time period (LB) has not elapsed, the method returns directly to step 64 without transmitting the current vector of monitored parameters (P) and without updating the previous vector of monitored parameters (X) or threshold value (T). This can help to avoid the system transmitting and updating the threshold criterion at too high a frequency. Considering step 65 again, if the difference does not exceed the threshold, the method proceeds to step 67, in which it is determined whether or not a maximum time period (UB) has elapsed between obtaining the current vector of monitored parameters (P) and obtaining the previous vector of monitored parameters (X). In this embodiment, the maximum time period (UB) is 1800 seconds, although other maximum time periods could be used as desired. If the maximum time period (UB) has not elapsed, the method returns directly to step 64 without transmitting the current vector of monitored parameters (P) and without updating the previous vector of monitored parameters (X) or threshold value (T), as per FIG. 4. However, if the maximum time period (UB) has elapsed, the method returns to step 63, in which the current vector of monitored parameters (P) are transmitted to the remote server ("publish P"), the current vector of monitored parameters (P) is now considered as being the previous vector of monitored parameters (X), and the threshold value (T) is updated such that $T=\beta|X|+\alpha$. This can help to avoid the system transmitting and updating the threshold criterion at too low a frequency.

In any of the above embodiments of FIGS. 3-6, the system 10 can operate in a first mode of operation in which no threshold criteria are used when determining whether or not to transmit the measured parameters, so as to allow the electrical installation to be initially analysed at a higher data granularity to build up a model for the electrical installation, and then the system 10 can operate in a second mode of operation in which the threshold criteria are used, so as to allow the electrical installation to continue to be analysed using the model of the electrical installation but at a much lower data granularity. In other embodiments, the first mode of operation can instead use lower threshold criteria than the second mode of operation, e.g. by setting the scaling value and/or offset value appropriately for the respective modes of operation.

The invention claimed is:

1. A method of monitoring parameters of an electrical installation, the method comprising:
   performing plural successive iterations of a process in which a difference between a current set of plural monitored parameters of the electrical installation and a previous set of plural monitored parameters of the electrical installation is compared to a threshold criterion;
   wherein, when the difference is determined as exceeding the threshold criterion, the current set of plural monitored parameters is at least one of transmitted and stored;
   wherein, when the difference is determined as not exceeding the threshold criterion, the current set of plural monitored parameters is at least one of not transmitted and not stored; and
   wherein the difference which is compared to the threshold criterion comprises or is based on a vector difference between a vector formed of the current set of plural monitored parameters and a vector formed of the previous set of plural monitored parameters.

2. The method as claimed in claim 1, wherein the threshold criterion comprises only a single threshold value.

3. The method as claimed in claim 1, wherein the difference which is compared to the threshold criterion comprises or is based on a modulus of a difference between the current set of plural monitored parameters and the previous set of plural monitored parameters.

4. The method as claimed in claim 1, wherein the threshold criterion is based on the previous set of plural monitored parameters.

5. The method as claimed in claim 4, wherein the threshold criterion is derived from the set of plural monitored parameters in question using a formula.

6. The method as claimed in claim 5, wherein the formula at least one of scales and offsets the set of plural monitored parameters in question.

7. The method as claimed in claim 6, wherein the formula at least one of scales and offsets a modulus of a vector formed of the set of plural monitored parameters in question.

8. The method as claimed in claim 1, wherein when the difference is determined as exceeding the threshold criterion, the threshold criterion is updated based on the current set of plural monitored parameters.

9. The method as claimed in claim 1, wherein when the difference is determined as not exceeding the threshold criterion, the threshold criterion is not updated based on the current set of plural monitored parameters.

10. The method as claimed in claim 1, wherein when the difference is determined as exceeding the threshold criterion, the method further comprises:
determining whether or not a minimum time period has elapsed between obtaining the current set of plural monitored parameters and obtaining the previous set of plural monitored parameters;
wherein, when the minimum time period is determined as having elapsed, the current set of plural monitored parameters is at least one of transmitted and stored; and
wherein, when the minimum time period is determined as not having elapsed, the current set of plural monitored parameters is at least one of not transmitted and not stored.

11. The method as claimed in claim 1, wherein when the difference is determined as not exceeding the threshold criterion, the method further comprises:
determining whether or not a maximum time period has elapsed between obtaining the current set plural monitored parameters and obtaining the previous set of plural monitored parameters;
wherein, when the maximum time period is determined as not having elapsed, the current set of plural monitored parameters is at least one of not transmitted and not stored; and
wherein, when the maximum time period is determined as having elapsed, the current set of plural monitored parameters is at least one of transmitted and stored.

12. The method as claimed in claim 1, wherein the method comprises operating in a first mode of operation in which the threshold criteria are not used and then operating in a second mode of operation in which the threshold criteria are used.

13. The method as claimed in claim 1, wherein the electrical installation comprises a domestic, commercial or industrial installation.

14. The method as claimed in claim 1, wherein the electrical installation comprises an electrical installation for a living accommodation, office, school, college, university, hotel, hospital, shop, restaurant, station, airport or manufacturing facility.

15. A system for monitoring parameters of an electrical installation, the system comprising:
processing circuitry configured to perform plural successive iterations of a process in which a difference between a current set of plural monitored parameters of the electrical installation and a previous set of plural monitored parameters of the electrical installation is compared to a threshold criterion;
wherein, when the processing circuitry determines that the difference exceeds the threshold criterion, the processing circuitry is configured to at least one of transmit and store the current set of plural monitored parameters;
wherein, when the processing circuitry determines that the difference does not exceed the threshold criterion, the processing circuitry is configured to at least one of not transmit and not store the current set of plural monitored parameters; and
wherein the difference which is compared to the threshold criterion comprises or is based on a vector difference between a vector formed of the current set of plural monitored parameters and a vector formed of the previous set of plural monitored parameters.

* * * * *